(12) United States Patent
Oue

(10) Patent No.: US 6,433,709 B1
(45) Date of Patent: Aug. 13, 2002

(54) DECODING METHOD AND DECODING APPARATUS FOR VARIABLE LENGTH CODE WORDS, AND COMPUTER READABLE RECORDING MEDIUM FOR STORING DECODING PROGRAM FOR VARIABLE LENGTH CODE WORDS

(75) Inventor: Akihiro Oue, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/659,823

(22) Filed: Sep. 11, 2000

(30) Foreign Application Priority Data

Sep. 10, 1999 (JP) .............................. 11-257986

(51) Int. Cl.$^7$ ................................ H03M 7/40
(52) U.S. Cl. ........................... 341/67; 341/106
(58) Field of Search .................... 341/67, 50, 65, 341/106

(56) References Cited

U.S. PATENT DOCUMENTS 5,155,831 A * 10/1992 Emma et al. ............... 395/425
5,254,991 A   10/1993 Ruetz et al.
5,652,878 A *  7/1997 Craft .......................... 395/601
5,999,111 A * 12/1999 Park et al. ..................... 341/67

FOREIGN PATENT DOCUMENTS

JP          10-163880          6/1998

* cited by examiner

*Primary Examiner*—Peguy JeanPierre
(74) *Attorney, Agent, or Firm*—Oblon, Spivak, McClelland, Maier & Neustadt, P.C.

(57) ABSTRACT

A decoding apparatus using tables T1, T2, and T4 has a buffer memory (1), a code word separation circuit (2), a comparator (31), and an addition circuit (4). In the table T1, decoded data items corresponding to each code word are stored based on each code length as index. In the table T2, addresses in the table T1 corresponding to the minimum value in code words having each code length is stored based on the code length as index. In the table T4, the number of code words having each code length is stored based on the code length as index. The buffer memory (1) stores the real data part in a bit stream transferred from outside. The code word separation circuit (31) separates each bit data item from the buffer memory (1). The comparator (31) analyses the content of the data item transferred from the code word separation circuit (2). The addition circuit (4) adds the output from the comparator (31) to the output from the table T2.

24 Claims, 11 Drawing Sheets

FIG.2

| CODE LENGTH(i) | NUMBER (BITS(i)) OF CODE WORDS |
|---|---|
| 1 | 0 |
| 2 | 2 |
| 3 | 1 |
| 4 | 2 |
| 5 | 2 |
| . | . |
| . | . |
| . | . |

FIG.3

| K | HUFFSIZE(k) | CODE (HUFFCODE(k)) | DECODED DATA(k) |
|---|---|---|---|
| 0 | 2 | 00 | V2,0 |
| 1 | 2 | 01 | V2,1 |
| 2 | 3 | 100 | V3,0 |
| 3 | 4 | 1010 | V4,0 |
| 4 | 4 | 1011 | V4,1 |
| 5 | 5 | 11000 | V5,0 |
| 6 | 5 | 11001 | V5,1 |
| . | . | . | . |
| . | . | . | . |
| . | . | . | . |

| INDEX | CODE WORD |
|---|---|
| 1 | 0 |
| 2 | 00 |
| 3 | 100 |
| 4 | 1010 |
| 5 | 11000 |
| . | . |
| . | . |
| . | . |

FIG.5

INPUT : 1011011011101101

| i | T3(i) |   | temp |
|---|---|---|---|
| 1 | 0 | $\leq$ | 1 |
| 2 | 00 | $\leq$ | 10 |
| 3 | 100 | $\leq$ | 101 |
| 4 | 1010 | $\leq$ | 1011 |
| 5 | 11000 | $>$ | 10110 | addr=T2(i-1)+(temp-T3(i-1))=4
code=T1-1(addr)=V4,1

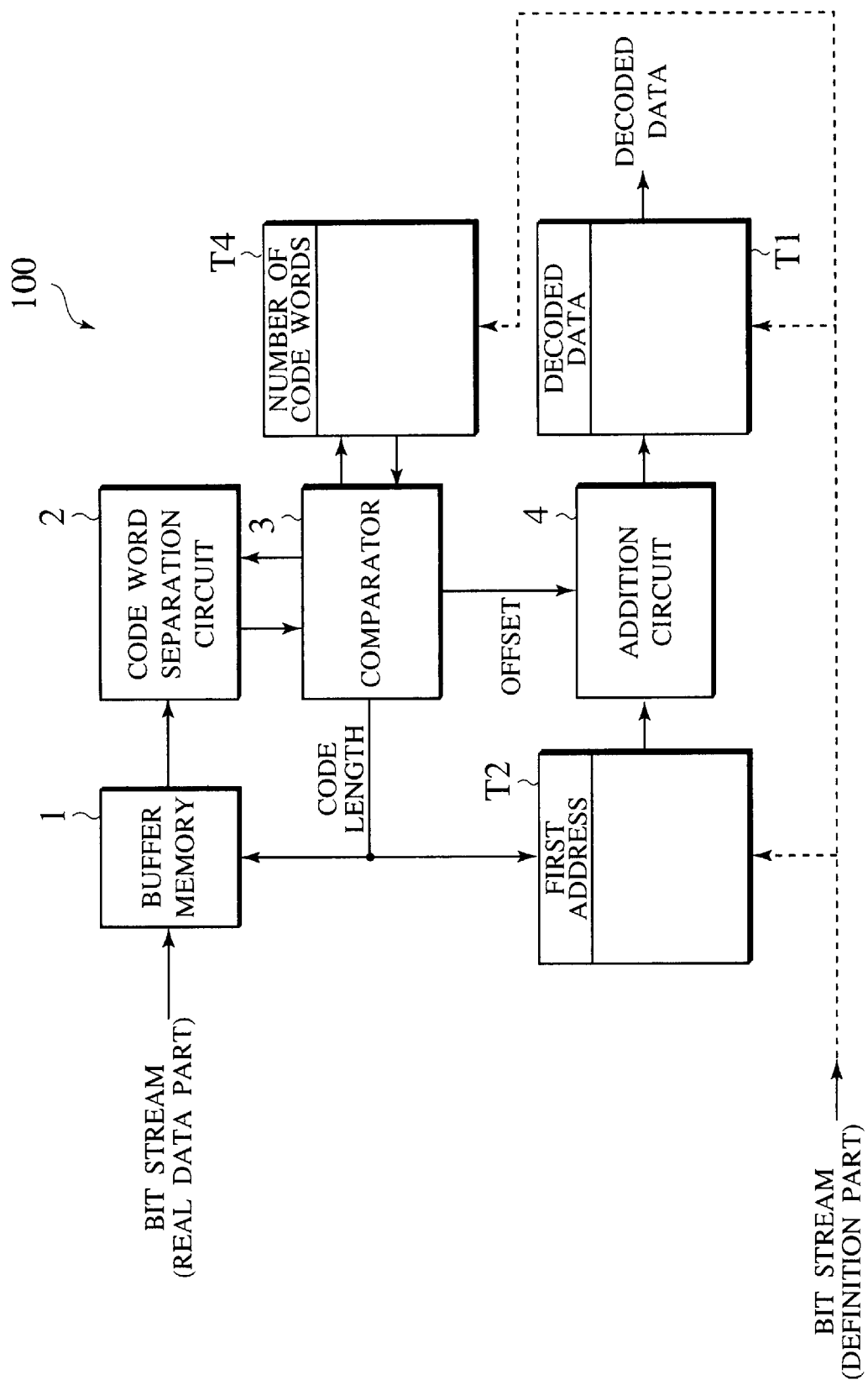

FIG.11

INPUT : 1011011011101101

| i | T4(i) | | temp |
|---|---|---|---|
| 1 | 0 | ≦ | 1 |
| 2 | 2 | ≦ | 2 |
| 3 | 1 | ≦ | 1 |
| 4 | 2 | > | 1 |

⟶ addr=T2(i)+temp=4
code=T1(addr)=V4,1

FIG.14

INPUT : 1011011011101101

| i | T4(i) | | temp | head |
|---|---|---|---|---|
| 1 | 0 | ≦ | 1 | 0 |
| 2 | 2 | ≦ | 2 | 0 |
| 3 | 1 | ≦ | 1 | 2 |
| 4 | 2 | > | 1 | 3 |

⟶ addr=head+temp=4
code=T1(addr)=V4,1

DECODING METHOD AND DECODING APPARATUS FOR VARIABLE LENGTH CODE WORDS, AND COMPUTER READABLE RECORDING MEDIUM FOR STORING DECODING PROGRAM FOR VARIABLE LENGTH CODE WORDS

CROSS-REFERENCE TO RELATED APPLICATION

This application is based upon and claims the benefit of priority from the prior Japanese Patent Application No. 11-257986, filed Sep. 10, 1999; the entire contents of which are incorporated herein by reference.

BACKGROUND OF THE INVENTION

1. Field of the Invention

The present invention relates to a decoding for variable length code words, and, more particularly, relates to a decoding method and a decoding apparatus for generating tables and detecting a code length of each code word after coding and for generating an address in the table in which decoded data items are stored, and also relates to a computer readable recording medium in which a decoding program is stored.

2. Description of the Related Art

There is a conventional decoding apparatus for decoding a variable length code word consisting of a definition part and a real data part, as shown in FIG. 1, for example. The definition part of the variable length code word includes the number of code words corresponding to each code length and decoded data items corresponding to each code word.

FIG. 1 is a block diagram showing a configuration of the conventional decoding apparatus.

As shown in FIG. 1, the conventional decoding apparatus comprises tables T1, T2, and T3, a buffer memory 11 for storing the real data part in the bit stream including variable length code words, a code word separation circuit 12 capable of separating one bit from the real data part stored in the buffer memory 11, a comparator 13 for comparing an output data item from the code word separation circuit 12 with the data items stored in the table T3, and an addition circuit 14 for adding the output from the comparator 3 to an output data item obtained from the table T2.

The table T1 stores the decoded data items included in the definition part that are arranged in smaller order of the codewords. The table T2 stores the address to be used for searching the table T1, and the address indicates a memory field storing the decoded data item for the smallest value in code words having a same code length. In the table T2, the code length is used as index. The table T3 stores the code word of the smallest value in code words having a same code length. In the table T3, the code length is also used as index.

There is a following conventional decoding method of decoding variable length code words in JPEG, for example.

At first, the tables T1 to T3 are generated by analyzing the definition (see FIG. 2) included in the head part of the bit stream. FIG. 2 shows an example of the definition stored in the head part in which the number of code words having a code length 0 is zero, the number of code words having a code length 2 is two, the number of code words having a code length 3 is one, the number of code words having a code length 4 is two, and the number of code words having a code length 5 is two.

The generation methods of the tables T1 to T3 will be explained in detail.

At first, as shown in FIG. 3, the code (HUFFCODE(k)) corresponding to each code length (HUFFSIZE(k)) is obtained based on the number of code words. In the example shown in FIG. 3, the first code word (as the smallest code) in the code words having the code length 2 is determined as "00", and the second code word is determined as "0" because the number of code words having the code length 2 is only two. Similarly, the first code (as the smallest code) in the code words having the code length 4 is determined as "1010", and the second code is determined as "1011" because the number of code words having the code length 4 is also two. In this example, each code is expressed under the binary system. The decoded data item corresponding to each code word is separated from the head part and then stored in the table T1. In addition, as shown in FIG. 4, the smallest code word in code words having a same code length (namely, per same code length) is stored in the table T3 according to each code length as index. Further, the first address in the table T1 in which the decoded data items corresponding to the smallest code word in code words having a same code length are stored is stored in the table T2, as shown in FIG. 6.

An actual decoding process that uses the tables T1, T2, and T3 made by the above-described manner can be executed under the following procedures.

FIG. 7 is a flow chart showing the procedures of the conventional decoding method of decoding variable length code words. At first, the bit stream is stored in the buffer memory 11 in first-in order. The value "zero" is set to a register "temp" as an initial value, and the value "1" is set to a counter "i" as an initial value (Step S301).

The following operation is then performed by using the counter "i" that indicates a code length.

First, the first bit in the data stored in the buffer memory 11 is read and then added into the end of the register "temp". Next, the comparator 13 compares the value of the register "temp" with the smallest code word T3 (i) in code words having the code length "i" (where "i" is a positive integer) (Step S303).

The symbol "bits[i]" in FIG. 7 indicates the "i-th" bit in the codes. Because the maximum code length in JPEG is 16, these operations are repeated from i=1 to i=16 (Steps S302 to S305). As a result, when it is firstly detected at Step S303 in this repeating process that the value T3(i) is greater than the value of the register "temp", the code length "leng" becomes "i−1" (Steps S305 and S306). On the other hand, when "i" is not detected in the comparison at Step S303, the code length becomes 16 (Step S305 and S306). Thereby, the code word is determined as the "leng" bits from the first bit to the "(i−1)-th" bit (see "leng=i−1 and word=bits[1:i−1]" at Step S306). Thus, the code word "word" is expressed by bits[1:i−1] in FIG. 7.

Then, the address T2(leng) in the table T1 indicating the smallest code word in the code words having the code length "leng" in the table T1 by referring the table T2 by using the code length "leng" as index. In addition, an offset (as a difference) from the smallest code word in the same code length can be obtained by subtracting the smallest code word T3(leng) having the same code length "leng" from the code word "word" (Step S307).

After this step S307, the value "addr" of the pointer (hereinafter referred to as pointer "addr") is calculated by adding the offset "offs" to T2(leng) (Step S308). The table T1 is searched by using this pointer in order to obtain the decoded data item corresponding to the code word "word" (Step S309).

For example, FIG. 5 shows the value of each variable at Step S303 when the first bit in the bit stream is "1011011011101101". That is, the condition "tem T3(i)" is recognized at Step S303 when "i"=5 (temp=10110). Thereby, "leng"=5−1=4 is calculated at Step S306. Because T3="1010" when "leng"=4(see FIG.4 ), the offset "offs" becomes 1 (offs=1011−1010=1). The address "addr" of the decoded data item in the table T1 can be calculated by adding this offset "offs" to the first address T2 when i=4. The decoded data item is then obtained based on the address "addr". As shown in FIG. 6, the decoded data item "data (V4,1)" stored in the table T1 can be obtained by using a new index calculated by adding the offset "offs" to the first address obtained from the table T2.

By using the manner described above, the decoding for a code word is completed. When the decoding for the following code word is performed, the decoding apparatus eliminates the data item of the code length "leng" from the buffer memory 11, or shifts the pointer to the first bit in the following code word to be decoded in order to point the first bit in the following code word.

However, in the conventional decoding apparatus, the overhead to generate the tables T1 to T3 occurs because the table T3 that stores the smallest code word in code words per code length must be generated based on the definition part in the variable length code word. That is, in the decoding of the bit stream in JPEG, there is a drawback that the overhead of the generation of the tables becomes large because the various variable length tables are defined based on the number of code words per code length. Furthermore, because the size of the table T3 is determined based on the maximum number of code words per code length, it must be necessary to prepare 136 bits (=1+2+3+4+5+6+7+8+9+10+ 11+12+13+14+15+16) in a hard logic, or to prepare 256 bits (16 bits×16) in a RAM, there is a drawback that the entire size of the memory storing the tables T1, T2, and T3 in the conventional decoding apparatus becomes large. Moreover, because the size of the comparator 13 for comparing each code word with the smallest value in code words per code length becomes 16 bits. These drawbacks of the conventional decoding apparatus cause to increase the entire size of the decoding apparatus itself and to reduce the decoding speed.

SUMMARY OF THE INVENTION

Accordingly, an object of the present invention is, with due consideration to the drawbacks of the conventional technique, to provide a decoding method and a decoding apparatus capable of increasing a decoding speed and capable of decreasing the entire size of the decoding apparatus by reducing the size of each table to be used during the decoding process, and to provide a computer readable recording medium in which a decoding program is stored.

In accordance with a preferred embodiment of the present invention, a decoding method of decoding variable length code words consisting of a definition part and a real data part formed by a code word sequence. In the definition part, the number of code words corresponding to each code length and decoded data items corresponding to the code words are defined. The decoding method has the steps of making a table in which the number of code words corresponding to each code length as index is stored, setting an initial value "1" to a pointer, performing following steps (1) and (2) from the minimum value in the code lengths as index in the table in increasing order: (1) adding one bit in the code word sequence in the real data part designated by the pointer to the end of a register; and (2) comparing a value in the table corresponding to the code length as index with the value of the register, and subtracting the value in the table from the value of the register, and adding the value of the pointer by "1" when the value of the register is not less than the value of the table. The decoding method further has repeating the steps (1) and (2) based on the following code length as index and the value of the register after the subtraction, detecting the current code length as index for the code length of a target code word to be detected when the value of the register is smaller than the value of the table at the step (2), and specifying the decoded data item corresponding to the code word based on the value of the register and the detected code length.

Accordingly, when compared with the conventional decoding method to make and use a table storing the minimum value or the maximum value in code words having each code length based on the code length as index, because the decoding method of the present invention makes and uses the table storing the number of code words having each code length based on the code length as index, it is possible to reduce the overhead of the memory size to store the table and to perform the decoding process easily at a high speed.

Furthermore, the decoding method as another preferred embodiment of the present invention has the steps of adding accumulatively the number of code words from the minimum value of the code length to the detected code length as index, and using an address, in order to get a target decoded data item, obtained by adding the accumulated value of the number of code words to the current value of the register.

Accordingly, it is possible to use no table in which the addresses indicating the minimum value or the maximum value in code words per code length based on the code length as index when the addresses in a table in which decoded data items are stored. This can reduce the memory size and performs the decoding process at a high speed.

In accordance with a preferred embodiment of the present invention, a decoding apparatus for decoding variable length code words consisting of a definition part and a real data part formed by a code word sequence. In the definition part, the number of code words corresponding to each code length and decoded data items corresponding to the code words are defined. Thee decoding apparatus has a memory section, a pointer, and a comparison arithmetic operation section. The memory section stores a table in which the number of code words corresponding to each code length as index is stored. An initial value of the pointer is "1". The comparison arithmetic operation section performs following operations (1) and (2) from the minimum value in the code lengths as index in the table in increasing order: (1) adding one bit in the code word sequence in the real data part designated by the pointer to the end of a register; and (2) comparing a value in the table corresponding to the code length as index with the value of the register, and subtracting the value in the table from the value of the register, and adding the value of the pointer by "1" when the value of the register is not less than the value of the table. In the decoding apparatus of the preferred embodiment, the comparison arithmetic operation section repeats the operations (1) and (2) based on the following code length as index and the value of the register after the subtraction, and detects the current code length as index for the code length of a target code word to be detected when the value of the register is smaller than the value of the table at the operation (2), and specifies the decoded data item corresponding to the code word based on the value of the register and the detected code length.

Accordingly, when compared with the conventional decoding apparatus to use a table storing the minimum value or the maximum value in code words having each code length based on the code length as index, because the present invention uses the table of a small size to store the number of code words having each code length based on the code length as index, it is possible to reduce the memory size to store the table and to reduce the overhead of the comparator. This can cause to provide the decoding apparatus of a small size and to perform the decoding process easily at a high speed.

Furthermore, the decoding apparatus as another preferred embodiment of the present invention further has an accumulative addition circuit for accumulatively adding the number of code words from the minimum value of the code length to the detected code length as index. In the decoding apparatus, the comparison arithmetic operation section uses an address, in order to get a target decoded data item, obtained by adding the accumulated value of the number of code words obtained from the accumulative addition circuit to the current value of the register.

Accordingly, it is possible to use no table in which the addresses indicating the minimum value or the maximum value in code words per code length based on the code length as index when the addresses in a table in which decoded data items are stored. This can reduce the memory size and apply the remained memory to another purpose efficiently.

In accordance with a preferred embodiment of the present invention, a computer readable recording medium for storing a decoding program for decoding variable length code words consisting of a definition part and a real data part consisting of a code word sequence, and in the definition part the number of code words corresponding to each code length and decoded data items corresponding to the code words are defined, the recording medium storing the decoding program comprising the steps of: making a table in which the number of code words corresponding to each code length as index is stored; setting an initial value "1" to a pointer; performing following steps (1) and (2) from the minimum value in the code lengths as index in the table in increasing order: (1) adding one bit in the code word sequence in the real data part designated by the pointer to the end of a register; and (2) comparing a value in the table corresponding to the code length as index with the value of the register, and subtracting the value in the table from the value of the register, and adding the value of the pointer by "1" when the value of the register is not less than the value of the table. The decoding program further has the steps of repeating the steps (1) and (2) based on the following code length as index and the value of the register after the subtraction; detecting the current. code length as index for the code length of a target code word to be detected when the value of the register is smaller than the value of the table at the step (2); and specifying the decoded data item corresponding to the code word based on the value of the register and the detected code length.

The computer readable recording medium as another preferred embodiment further has the steps of: adding accumulatively the number of code words from the minimum value of the code length to the detected code length as index, and using an address, in order to get a target decoded data item, obtained by adding the accumulated value of the number of code words to the current value of the register.

Accordingly, it is possible to store the decoding program capable of reducing the size of a memory and available to transfer it because of the reduction of the tables and of easy execution of the decoding process at a high speed. In addition, it is also possible to realize the decoding method and the decoding apparatus described above by installing the decoding program stored in the recording medium to a general purpose computer such as a personal computer and the like.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 2 is a diagram showing a definition of a variable length code word;

FIG. 3 is a diagram showing a procedure for generating tables based on a definition of a variable length code word;

FIG. 4 is a diagram showing the contents of a table T3 generated during a conventional decoding for variable length code words;

FIG. 5 is a diagram showing the contents of a comparison process in a conventional decoding method;

FIG. 8 is a block diagram showing a configuration of a decoding apparatus according to the first embodiment of the present invention;

FIG. 11 is a diagram showing the contents of a comparison process in the decoding method according to the first embodiment;

FIG. 14 is a diagram showing the contents of a comparison process in the decoding method according to the second embodiment.

DESCRIPTION OF THE PREFERRED EMBODIMENTS

Figure 1:
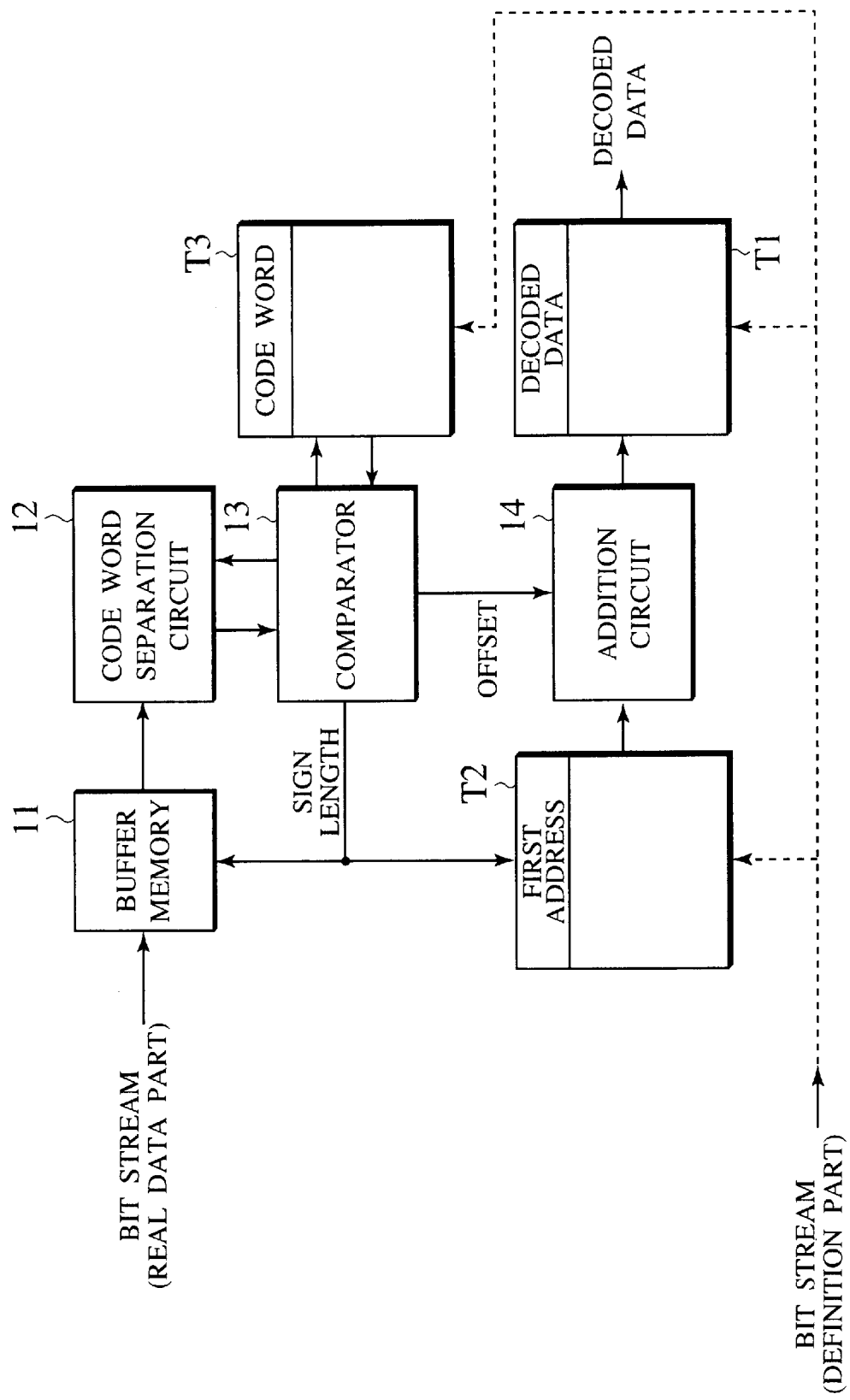
FIG. 1 is a block diagram showing a configuration of a conventional decoding apparatus for decoding variable length code words, which is commonly used in the prior art.
Figure 6:
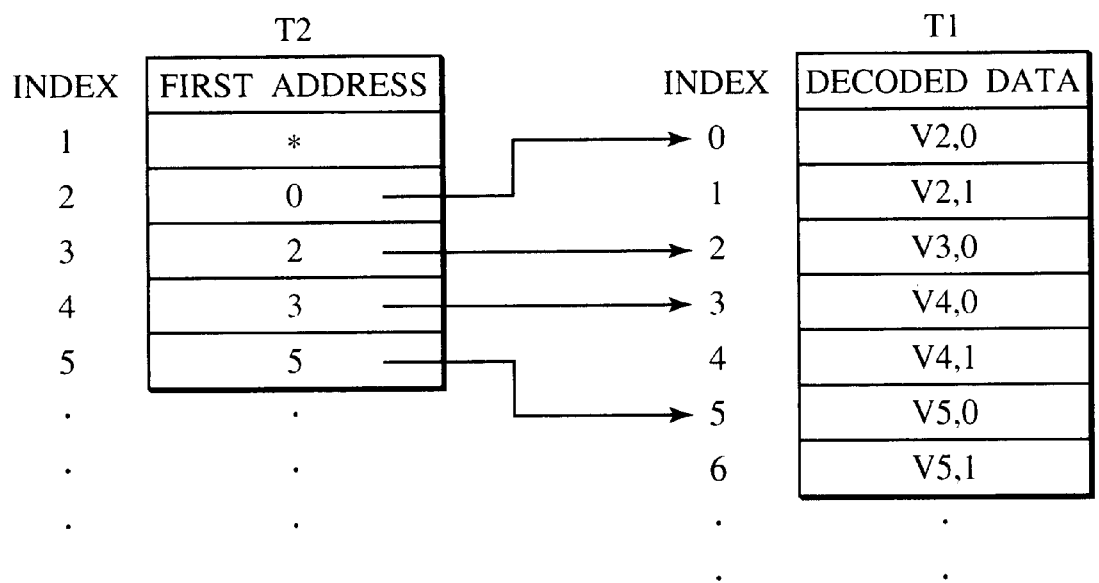
FIG. 6 is a diagram showing the contents of tables T1 and T2 generated in the decoding for a conventional decoding method.

Other features of this invention will become apparent through the following description of preferred embodiments that are given for illustration of the invention and are not intended to be limiting thereof.
First Embodiment
Configuration of the Decoding Apparatus A description will be given of the explanation of the decoding apparatus according to the first embodiment of the present invention.

FIG. 8 is a block diagram showing a configuration of the decoding apparatus 100 according to the first embodiment of the present invention. As shown in FIG. 8, the decoding apparatus of the first embodiment of the present invention comprises a memory in which tables T1, T2, and T4 are stored, a buffer memory 1 in which a bit stream transferred from outside is stored, a code word separation circuit 2 capable of separating one bit from a real data part in the bit stream stored in the buffer memory 1 and outputting the separated one, a comparator 31 for comparing the data from the code word separation circuit 2 with a value in the table T4, and an addition circuit 4 for adding a value from the table T2 to the output from the comparator 3.

In the table T1, decoded data items corresponding to each code word based on a code length as index are stored. In the table T2, addresses to be used for searching the table T1 (in which the decoded data items are stored) corresponding to the minimum value in code words per same code length are stored. The code length is also used as index in the table T2. The table T4 is generated directly based on the definition included in a head part in the bit stream. In the table T4, each code length in the definition shown in FIG. 2 is used as index, and the number of code words having a same code length is stored.

The comparator 3 is a comparison execution section for comparing the value in the table T4 indicated by the index with the value in a register "temp" (the register "temp" will be explained in detail later) in increasing order from the smallest value of the index. In a concrete example, the value of the table T4 is subtracted by the value of the register "temp" when the value of the register "temp" is equal to or more than the value of the table T4, and the comparison process is repeated by using the subtracted based on the following index, in order. When the value of the register "temp" is smaller than the value of the table T4, it can be detected that the current index is used as the code length.

Operation of the Decoding Apparatus

Next, a description will be given of the operation of the case in which the decoding apparatus 100 of the first embodiment having the above-described configuration performs the decoding for variable length code words in JPEG.

At first, both the tables T1 and T2 are generated by using the conventional manners that has been described in "Description of the related art" section. That is, the decoded data items corresponding to each code word are separated from the head part as the definition part in the bit stream and then stored to the table T1, and the first address in the table T1 indicating the decoded data item corresponding to each code word is stored into the table T2, because it often occurs that one or more code words have a same code length.

Figure 9:
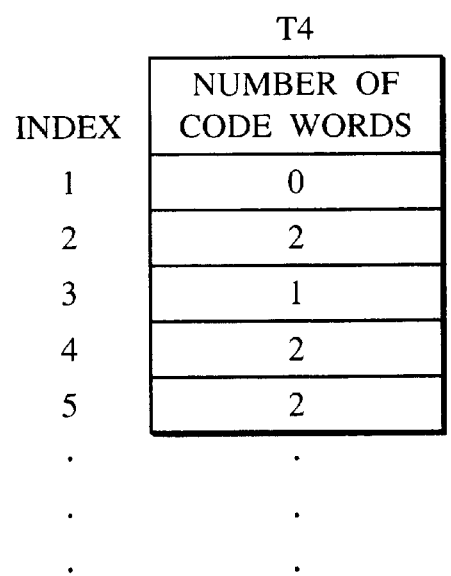
FIG. 9 is a diagram showing a table T4 generated in the decoding apparatus according to the first embodiment.
Figure 7:
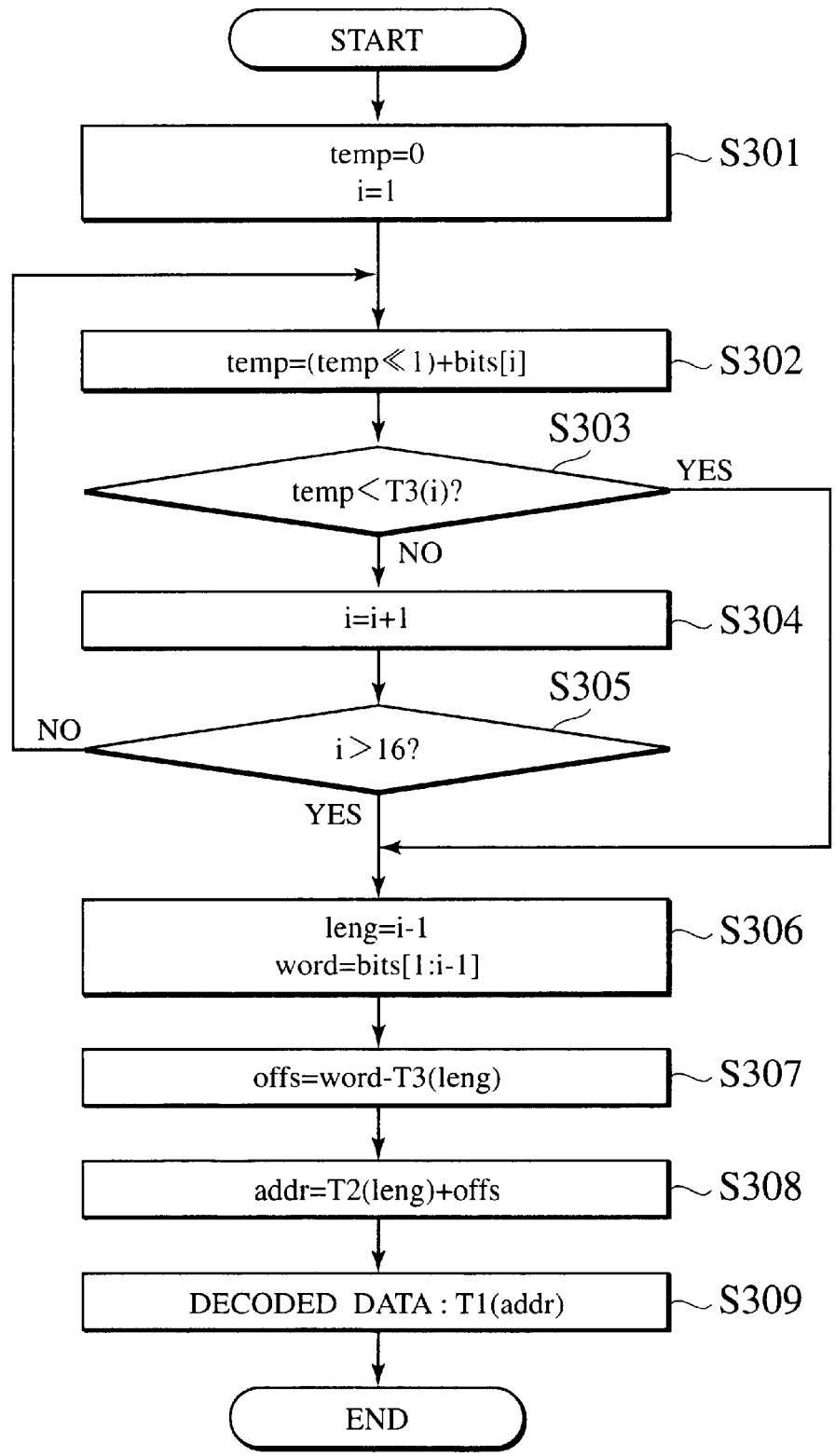
FIG. 7 is a flow chart showing the procedure in the conventional decoding process.

Further, as shown in FIG. 9, the decoding apparatus of the present invention stores the number of code words having a same code length into the table T4 by using the code length as index. This information with regard to the number of code words is stored in the head part of the bit stream.

Figure 10:
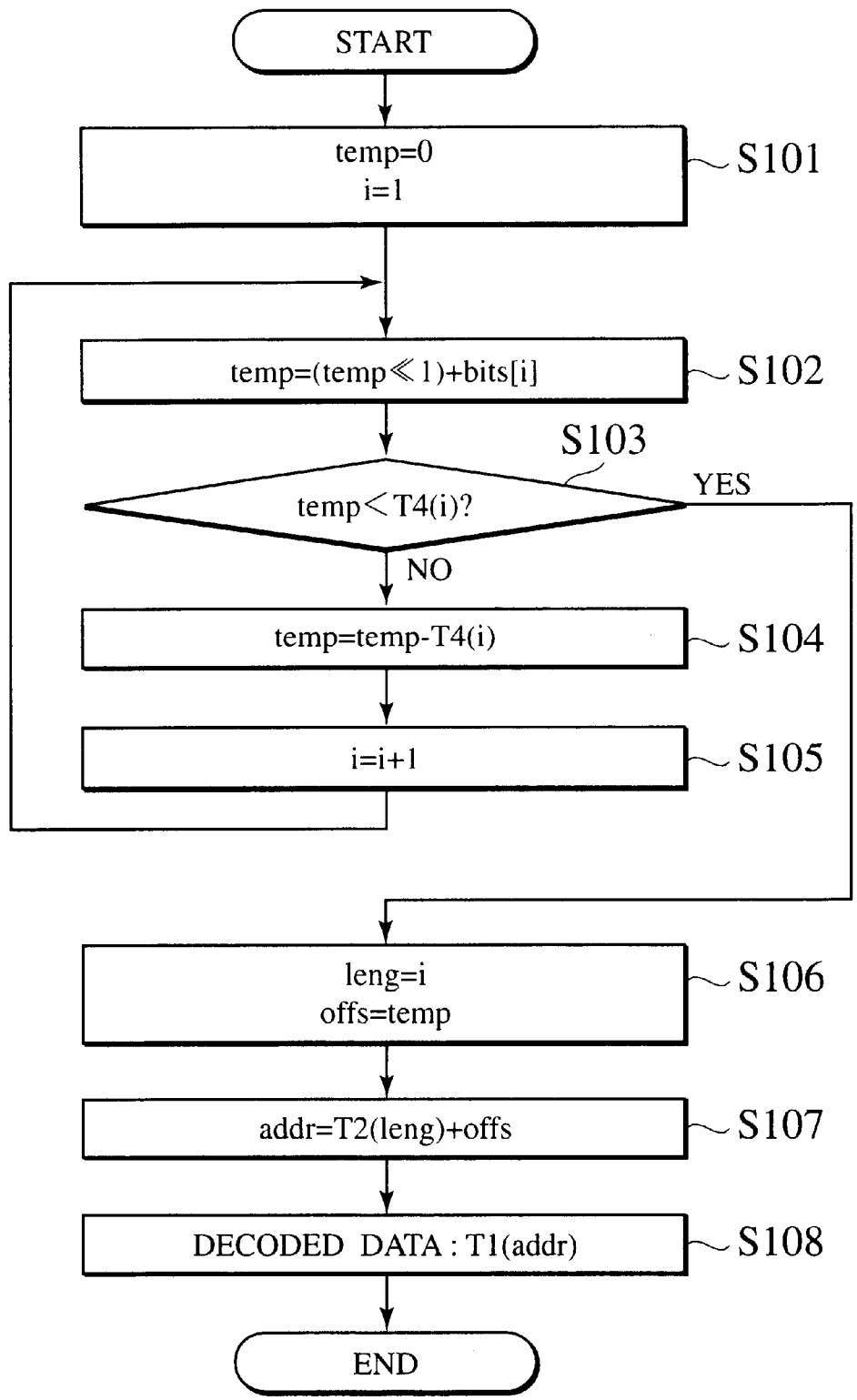
FIG. 10 is a flow chart showing the procedure of a decoding method according to the first embodiment.

The concrete decoding process using the tables T1, T2, and T4 is performed by the following procedure. FIG. 10 is a flow chart showing the decoding procedure for variable length code words according to the decoding method of the first embodiment.

At first, as shown in FIG. 10, the bit stream is stored into the buffer memory 1 in first-in order, and the value "0" is set to the register "temp" and the value "1" is set to the counter "i" as their starting values (Step S101).

The following operations are performed by using the counter "i" that estimates the code length.

At first, according to the counter value "i", bit data items counted from the first bit to the "i-th" bit are read from the buffer memory 2. For example, the counter value "i" is 1(i=1), the first bit data item is read from the buffer memory 2. Then, the bit data are added to the end of the register "temp", the value in the register "temp" is transferred to the comparator 31 (Step S102). Next, the comparator 31 compares the value of the register "temp" with the value T4(i) indicating the number of code words corresponding to the code length "i" obtained from the table T4 (Step S103).

As a result, when the value of the register "temp" is equal to or greater than the value T4(i), the value of the register "temp" is subtracted by the value T4(i) (Step S104). On the other hand, these steps S102 to S105 are repeated from i=1 to i=16 until the value T4(i) is greater than the value of the register "temp". When the value T4(i) is over the value of the register "temp", the current value "i" means the code length "leng", and the value of the register "temp" is used as the offset "offs" from the minimum value in code words having the same code length "leng" (Step S106).

By searching the table T2 based on the code length "leng" as index, the address T2(leng) in the table T1 for the smallest value in code words having the code length "leng" can be obtained. The pointer value "addr" is then obtained by adding the value T2(leng) to the value "offs" (Step S107). Thereby, the table T1 is searched by using this value "addr" of the pointer in order to obtain the decoded data "data" (Step S108).

A concrete example based on the above procedure will be explained.

For example, the head part in the bit stream is "1011011011101101", FIG. 11 shows the value of each variable at Step S103 in which the comparison is performed. In FIG. 10, the value of the register "temp" is expressed based on decimal notation.

As shown in FIG. 11, the first value of the register "temp" that has been initialized is 0 (Step S101). After this, the value of the register "temp" becomes "1" when the first bit in the bit stream in the buffer memory 1 is added to the register "temp" (Step S102). Because the value T(1) is 0, the value of the register "temp" is greater than the value T(1). The operation flow goes to Step S104. That is, the value of the register "temp" is subtracted by the value T4(1) (=0). Then, the value of the register "temp" is added by the value "0" of the following bit "bit[2]" (Steps S104, S105, and S102). In FIG. 11, because the values are expressed by decimal notation, when the value "bit[i] is added, the following equation is necessary:

$$\text{"temp"} \times 2 + \text{bit}[i].$$

Accordingly, the value of the register "temp" becomes 2(=1× 2+0).

When i=4(temp=1), it is detected that temp<T4(i), the value "leng"=i=4 is calculated at Step S106. At this step, the offset "offs" is 1 because the value of the register "temp" becomes the offset "offs". The address "addr" of the decoded data in the table T1 is obtained by adding the value T2 (leng) (as the first address) to the offset "offs". Thereby, the decoded data can be obtained.

That is, like the prior technique, the first address is obtained by comparing the counter "i" with the index in the table T2, and the decoded data "data(V4,1)" stored in the table T1 can be then obtained by searching the table T1 with a new address obtained by adding the offset "offs" to the address "addr".

The decoding for one code word is performed by the procedure described above. In order to continue the decoding for the following code word, it is necessary to eliminate the data items corresponding to the code length "leng" or the pointer indicating the data stored in the buffer memory 1 is shifted to the first bit in the following code word.

Next, a description will be given of the explanation that the decoding method performed by the decoding apparatus of the present invention can obtain the same decoded word with a high speed when compared with the conventional decoding method.

First, it is defined that the value of the "i-th" bit in a bit stream stored in the buffer memory 1 is "s[i]".

In the conventional decoding apparatus, the value T3(i) can be obtained by searching the table T3 based on the index "i". This operation can be expressed by the following equation:
1) when i=1, T3(1)=0
2) when i>1, $$T3(i) = \sum_{n=1}^{i-1} bits[n] \times (i-n).$$

In addition, at the "i-th" comparison operation, the value "temp(i)" of the register can be obtained by the following equation:

$$temp(i) = \sum_{n=i}^{i} s[n] \times (i-n).$$

Thereby, the value "temp(i)−T3(i)" can be obtained by the following equation:
1) When i=1, temp(1)−T3(1)=s[1].
2) When i>1, $$temp(i) - T3(i) = \sum_{n=1}^{i-1} \{(s[n] - bits[n]) \times 2^{(i-n)}\} + s[i] \ldots (*1).$$

The smallest value "i" under the condition "temp(i)−T3(i) <0" satisfies the following the inequality sign equation:

$$\sum_{n=1}^{i-1} \{(s[n] - bits[n]) \times 2^{(i-n)}\} + s[i] < 0.$$

Because the value "s[i]" is only 1, $$\sum_{n=1}^{i-1} \{(s[n] - bits[n]) \times 2^{(i-n)}\} < 0.$$

Accordingly, $$\sum_{n=1}^{i-1} \{(s[n] - bits[n]) \times 2^{(i-1-n)}\} < 0 \ldots (*2).$$

On the other hand, in the decoding method executed by the decoding apparatus of the present invention, the value T4 (j) can be obtained by searching the table T4 based on the index "j". This operation can be expressed by the following equation:

$$T4(j)=bits[j].$$

At the "j-th" comparison operation, the value "temp' (j)" of the register can be expressed by the following equation:

1) When j=1, temp' (1)=s[1];
2) When j>1, $$temp'(j) = \sum_{n=1}^{j-1} \{(s[n] - bits[n]) \times 2^{(j-n)}\} + s[j] \ldots (*3).$$

Thereby, the value "temp" (j)−T4(j)" can be obtained by the following equation:

$$temp'(j) - T4(j) = \sum_{n=1}^{j} \{(s[n] - bits[n]) \times 2^{(j-n)}\} \ldots (*4).$$

The following is the reason why the decoding manner of the present invention is equivalent to the conventional decoding manner. That is, both the manners can obtain the same result. As for the Decision of the Code Length "leng"

When the inequality sign equation (*2) is compared with the equation (*4), because both the value "temp(i+1)−T3(i+ 1)" in the equation (*1) and the value "temp' (j)−T4(j)" in the equation (*4) have the same sign, it can be recognized that the manner of the present invention is equivalent to the conventional manner.

As for the Calculation Foe the Offset "offs"

Because both the equation (*1) and the equation (*3) can obtain the same result, both the decoding manner of the present invention and the conventional decoding manner can obtain the same offset value and the results of other operations.

As described above in detail, according to the decoding apparatus 100 and the decoding method of the first embodiment, because the table T4 stores directly the definition of variable length code words without any change, it is possible to reduce the overhead to make the tables when compared with the conventional decoding method. In addition, because the maximum number of code words having each code length in JPEG is limited within 8 bits, the size of the table T4 is only 100 bits (=1+2+3+4+5+6+7+8+ 8+8+8+8+8+8+8+8) in a random logic, or 128 bits (8 bits×16) for a RAM (, by the way, as has been explained in "Description of the Related Art" section, in the conventional decoding apparatus it must be necessary to prepare 136 bits (=1+2+3+4+5+6+7+8+9+10+11+12+13+14+15+16) in a hard logic, or to prepare 256 bits (16 bits×16) in a RAM), it is possible to reduce the entire size of the memory in the decoding apparatus of the present invention when compared with the conventional decoding apparatus using the table T3. Accordingly, it is also possible to incorporate the comparator 31 of a 8 bit configuration for comparing the value of the register "temp" with the value T4(i) (, on the other hand, the conventional decoding apparatus must require the comparator of a 16bit configuration). The present invention has the effect to provide the decoding apparatus of a small size.

Second Embodiment

Configuration of the Decoding Apparatus

Figure 12:
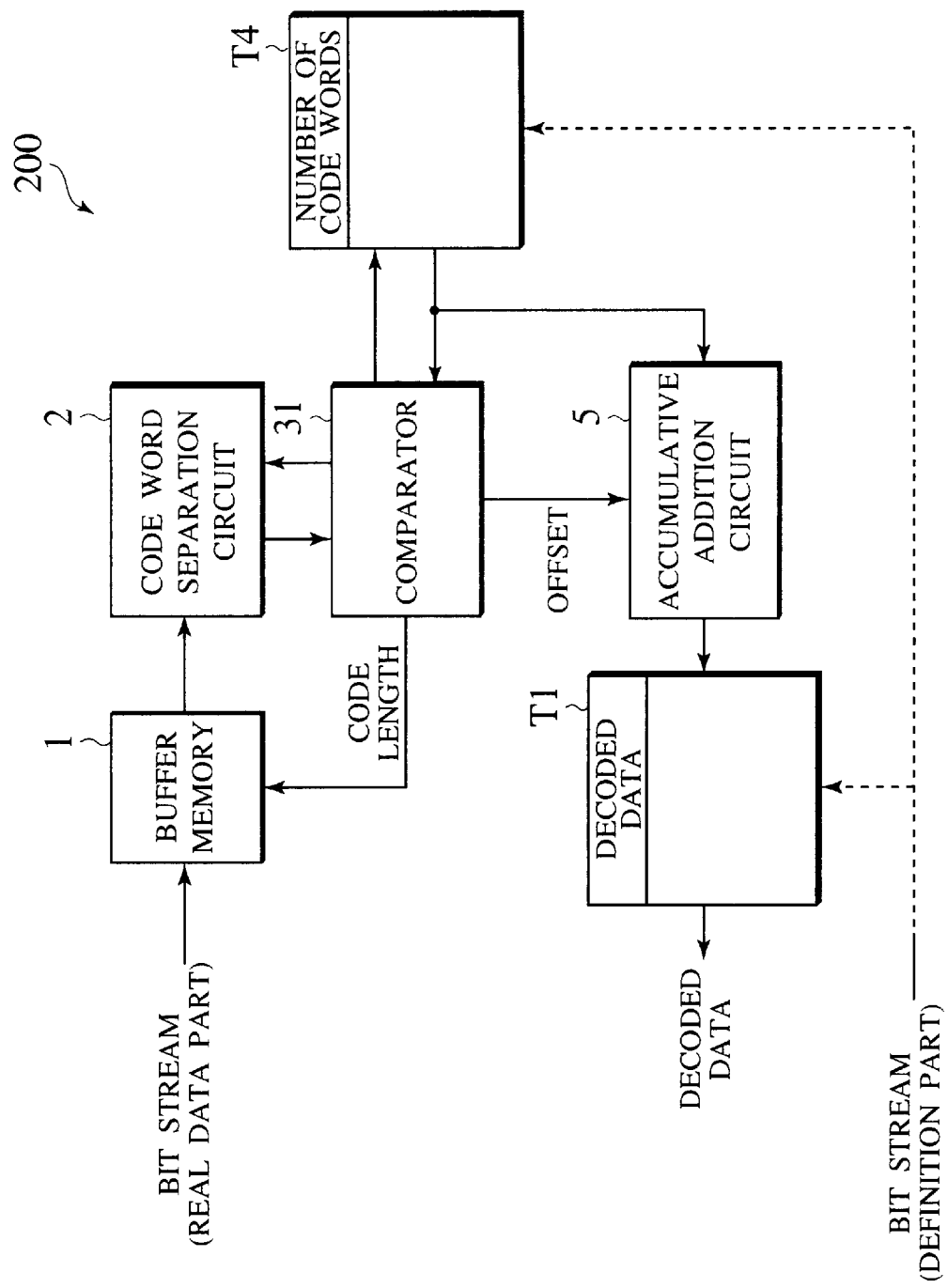
FIG. 12 is a block diagram showing a brief configuration of a decoding apparatus according to the second embodiment of the present invention.

FIG. 12 is a block diagram showing a brief configuration of the decoding apparatus 200 according to the second embodiment of the present invention.

As shown in FIG. 12, the decoding apparatus 200 of the second embodiment comprises a memory in which the tables T1 and T4 are stored, the buffer memory 1 in which a bit stream transferred from outside is stored, the codeword separation circuit 2 capable of separating one bit from a real data part in the bit stream stored in the buffer memory 1 and outputting the separated one, the comparator 31 for comparing the data from the code word separation circuit 2 with a value in the table T4, and an accumulative addition circuit 5 for adding accumulatively an output from the comparator 31 and the value obtained from the table T4.

The decoding apparatus according to the second embodiments of the present invention uses the same table T1 for storing the decoded words obtained by index, like the first embodiment and the prior art. In the table T1, the decoded data items corresponding to each code word based on a code length as index are stored. The table T4 is generated directly based on the definition included in the head part in the bit stream, like the first embodiment. In the table T4 ,each code length in the definition shown in FIG. 2 is used as index, and the number of code words having a same code length is stored.

The accumulative addition circuit 5 accumulatively adds the number (T4(1), . . . ) of code words from the minimum value of an index of the table T4 to the code length detected by the comparator 31.

Operation of the Decoding Apparatus

A description will be given of the decoding operation by the decoding apparatus of the second embodiment. It will be described in the following explanation that the decoding method handles one code word, like the explanation in the first embodiment.

Before the start of the decoding for variable length code words, both the tables T1 and T4 are generated based on the definition part in the bit stream. That is, the table T1 is generated by the same manner of the first embodiment and also the conventional decoding method. The table T4 is also generated by the same manner of the first embodiment.

The concrete decoding process using the tables T1 and T4 will be performed by the following procedure.

Figure 13:
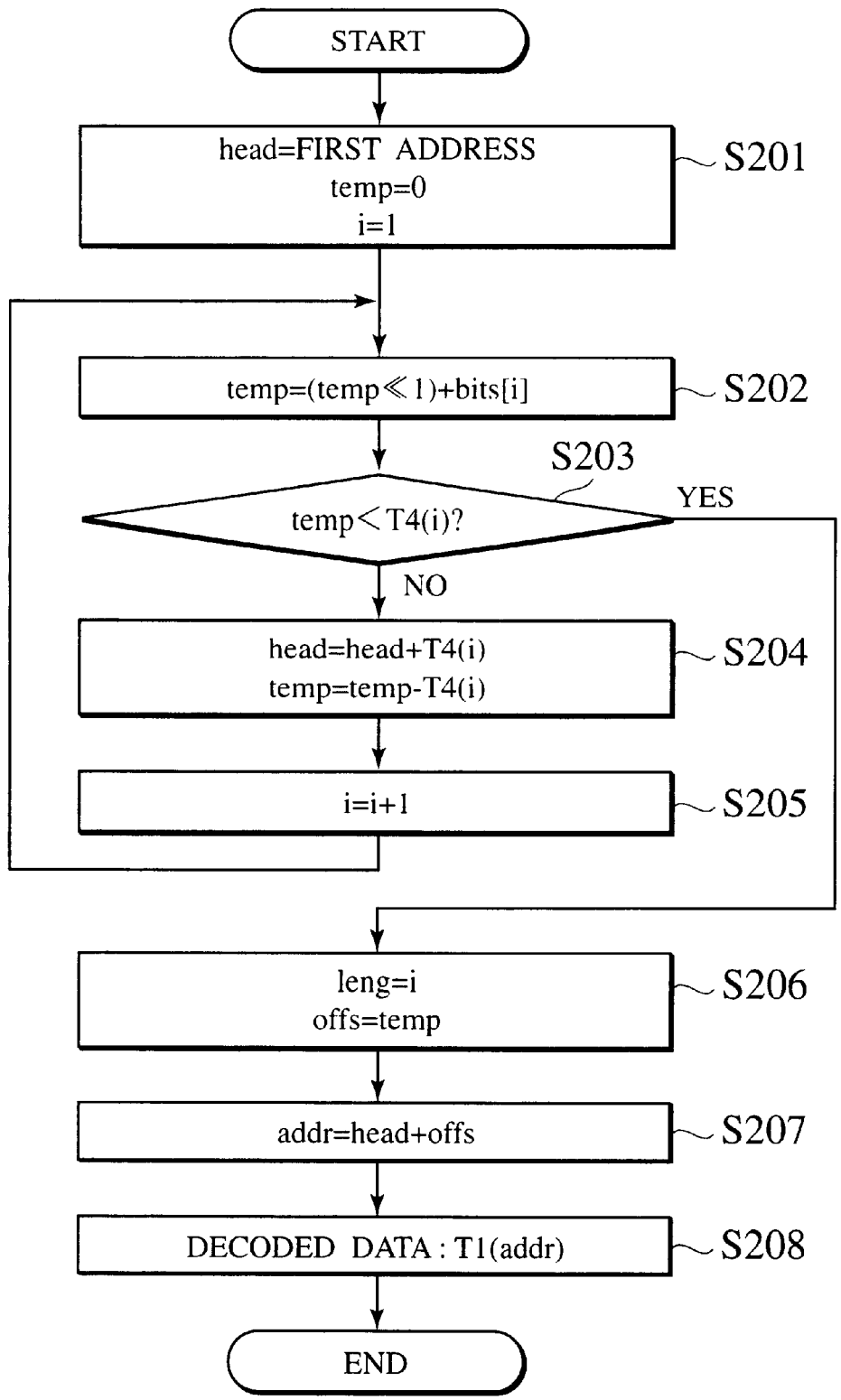
FIG. 13 is a flow chart showing the procedure of the decoding method according to the second embodiment of the present invention.

FIG. 13 is a flow chart showing the procedure of the decoding method according to the second embodiment of the present invention.

At first, as shown in FIG. 13, the bit stream supplied from outside is stored into the buffer memory 1 in first-in order. The first address is set to a variable "head", and both the register "temp" and the counter "i" are initialized. That is, the value "0" is set to the register "temp", and the value "1" is set to the counter "i" as their starting values (Step S201).

Next, the following procedure is performed by using the counter "i" indicating the code length.

The following operations are performed by using the counter "i" as an estimated code length.

At first, according to the counter value "i", bit data items counted from the first bit to the "i-th" bit are red from the buffer memory 1. For example, the counter value "i" is 1 (i=1), the first bit data item is red from the buffer memory 1. Then, the bit data are added to the end of the register "temp". The value in the register "temp" is transferred to the comparator 31 (Step S202).

Next, the comparator 31 compares the value of the register "temp" with the value T4(i) indicating the number of code words corresponding to the code length "i" obtained from the table T4 (Step S203). As a result, when the value of the register "temp" is equal to or greater than the value T4(i), the value of the register "temp" is subtracted by the value T4(i) and the accumulative addition circuit 5 adds the value T4(i) and the addition result is set to the variable "head" (Step S204). This process is repeated from i=1 to i=16 until the value T(4 ) is greater than the value of the register "temp". This repeating of the processes S202 to S205 can obtain the value "head" storing the accumulated T4(i) per each code length. This value "head" becomes the address in the table T1 corresponding to the code word of the smallest value in code words in the same code length "leng".

Next, the steps S202 to S205 are repeated in order to obtain the code length "leng" by using the counter "i" when the value T4(i) is greater than the value of the register "temp". The current value of the register "temp" becomes the offset value "offs" that indicates the offset from the address of the code word of the smallest value in code words having the same code length "leng" (Step S206).

Then, the pointer "addr" is calculated by adding the variable "head" to the offset "offs" (S207). This variable "head" is obtained by adding accumulatively the value T4(i). Thereby, the decoded data item "data" can be obtained by searching the table T1 based on the pointer value "addr" (S208).

For example, the head part in the bit stream is "1011011011101101", FIG. 14 shows the value of each variable at Step S203 shown in FIG. 13 in which the comparison is performed. That is, when i=4 (temp=1), it is detected that the condition temp<T4(i) is satisfied at Step S203, so that the value of the register "temp" can be directly used as the offset "offs". In addition, the value "head" is obtained by accumulating the values of T4(1) to T4(3). By adding the value "offs" (=temp) to the value "head", the address "addr" indicating the target decoded data stored in the table T1 can be obtained.

The decoding for one code word is performed by the procedure described above. In order to continue the decoding for the following code word, it is necessary to eliminate the data items corresponding to the code length "leng" or the pointer indicating the data stored in the buffer memory 1 is shifted to the first bit in the following code word.

As described above, according to the decoding apparatus 200 of the second embodiment, because the table T4 stores only the definition of variable length code words (namely, the table T4 stores only the number of code words), it is possible to reduce the overhead to make the tables when compared with the conventional decoding method. In addition, because the maximum number of code words having each code length in JPEG is limited within 8 bits, the size of the table T4 is only 100 bits (=1+2+3+4+5+6+7+8+8+8+8+8+8+8+8+8.) in a random logic, or 128 bits (8 bits×16) in a RAM (By the way, as has been explained in "Description of the Related Art" section, in the conventional decoding apparatus it must be necessary to prepare 136 bits (=1+2+3+4+5+6+7+8+9+10+11+12+13+14+15+16) in a hard logic, or to prepare 256 bits (16 bits×16) in a RAM.), it is possible to reduce the entire size of the memory in the decoding apparatus of the present invention when compared with the conventional decoding apparatus using the table T3. As a result, it is also possible to incorporate the comparator 31 of a 8 bit configuration for comparing the value of the register "temp" with the value T4(i) (, on the other hand, the conventional decoding apparatus must require the comparator of a 16bit configuration.). Thereby, the present invention has the effect to provide the decoding apparatus of a small size. Furthermore, because the decoding apparatus 200 of the second embodiment does not use the table T2. it is possible to further reduce the size of the entire memory.

Decoding Program for Decoding Variable Length Code Words

Figure 15:
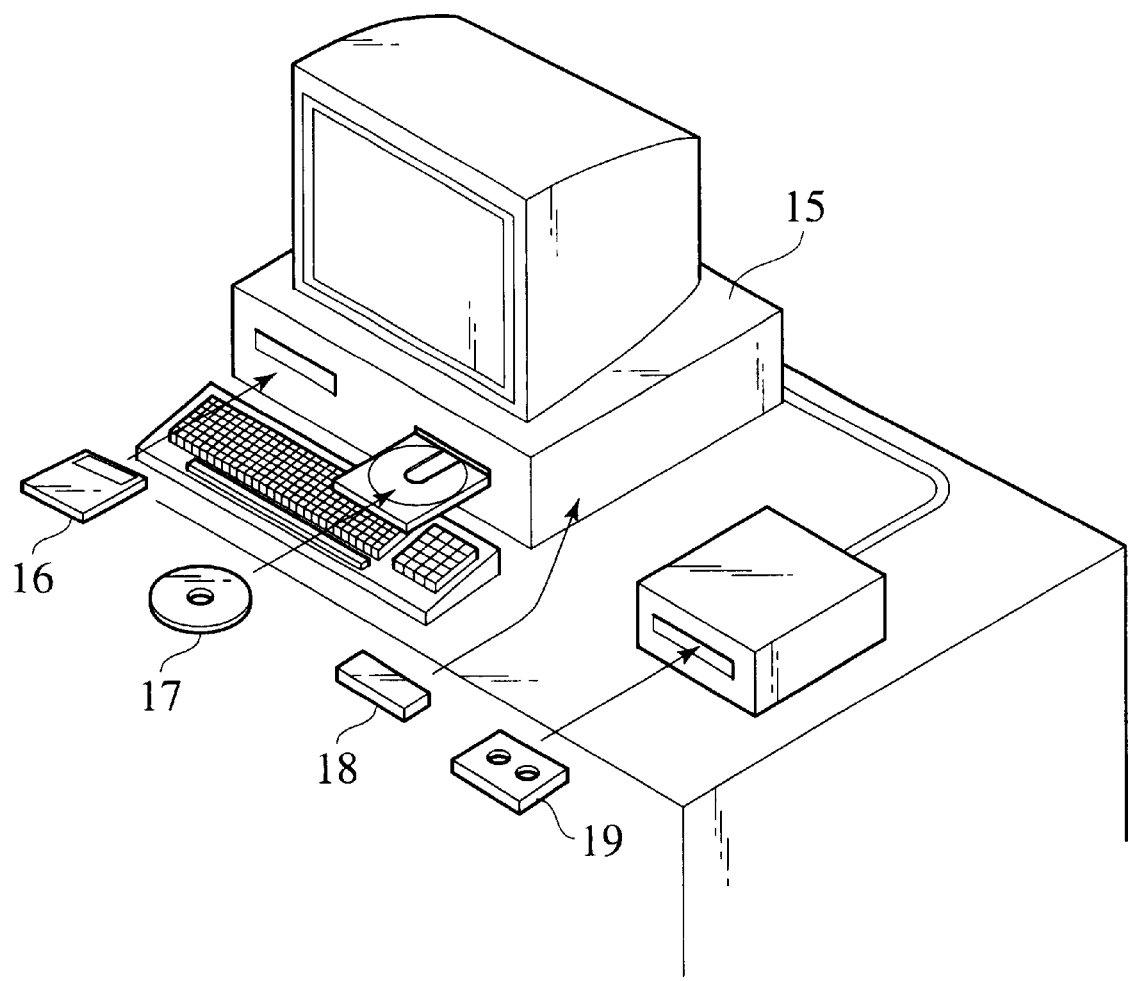
FIG. 15 is a perspective view showing a computer readable recording medium in which a decoding program for decoding variable length code words is stored.

The decoding apparatus of the present invention can be realized by making a decoding program for variable length code words described by a desired program language, and then by installing this decoding program into a general purpose computer such as a personal computer. That is, each procedure in the decoding methods shown in FIG. 10 and FIG. 13 are described by a desired program language so that the computer can execute the decoding processes. The decoding program for variable length code words can be recorded into each of recording mediums 16 to 19 that can be readable by the general-purpose computer 15 shown in FIG. 15. In a concrete example, there is the computer readable recording medium such as a floppy disk 16, a cassette tape 19, or an optical disk such as a CD-ROM 17, a RAM card 18, and the like.

By using the computer readable recording medium for storing the decoding program capable of reducing the entire size of the memory that is necessary for decoding variable length codewords, it is possible to easily store the decoding program, and to easily transfer the recording medium, and to easily install the decoding program into the computer.

As described above in detail, in the decoding apparatus and the decoding method according to the present invention, it is possible to reduce the size of tables or to eliminate tables to be used for decoding variable length code words. This can provide the decoding apparatus of a small configuration size, in which the size of the memory and the size of the comparator can be reduced, capable of performing the decoding process at a high speed.

Furthermore, according to the computer readable recording medium of the present invention, it is possible to store the decoding program capable of reducing the entire size of the memory that is necessary for decoding variable length code words, and there is the effect that this computer readable recording medium can be transfer easily, and that the decoding program can be installed into the computer.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A decoding method of decoding variable length code word, comprising:

generating a code word number storing table for storing a number of code words which have a specified code length and being indexed by a code length, the number of code words corresponding to each code length being obtained from a header of an inputted bit stream to be decoded;

generating a decoded data storing table for storing decoded data obtained from the header of the inputted bit stream;

separating data whose bit length is N indicated by a counter from the inputted bit stream;

comparing separated data with stored number of code words indexed by the code length N in the code word number storing table; and if the value of the separated data is smaller than the stored number of code words indexed by the code length N, obtaining target decoded data from the decoded data storing table using a pointer whose value is calculated by adding the value of the separated data to a starting address of stored decoded data corresponding to a code word of the code length N in the decoded data storing table.

2. The decoding method of claim 1, further comprising:

if the value of the separated data is not less than the number of code words indexed by the code length N, subtracting the stored number of code words from the value of the separated data and increasing N by one.

3. The decoding method of claim 1, wherein the inputted bit stream to be decoded is encoded by JPEG standard encoding system.

4. The decoding method of claim 1, wherein the inputted bit stream to be decoded consists of a header and a code word sequence, the header comprising the number of code words corresponding to each code length and decoded data corresponding to certain code words.

5. A decoding method of decoding variable length code word, comprising:

generating a code word number storing table for storing a number of code words which have a specified code length and being indexed by a code length, the number of code words corresponding to each code length being obtained from a header of an inputted bit stream to be decoded;

generating a decoded data storing table for storing decoded data obtained from the header of the inputted bit stream;

separating data whose bit length is N indicated by a counter from the inputted bit stream;

comparing the value of the separated data with the stored number of code words indexed by the code length N in the code word number storing table;

adding accumulatively the number of code words; and if the value of the separated data is smaller than the stored number of code words indexed by the code length N, obtaining target decoded data from the decoded data storing table using a pointer whose value is calculated by adding the value of the separated data to an accumulated number of code words.

6. The decoding method of claim 5, further comprising:

if the value of the separated data is not less than the number of code words indexed by the code length N, subtracting the stored number of code words from the value of the separated data and increasing N by one.

7. The decoding method of claim 5, wherein the inputted bit stream to be decoded is encoded by JPEG standard encoding system.

8. The decoding method of claim 5, wherein the inputted bit stream to be decoded consists of a header and a code word sequence, the header comprising the number of code words corresponding to each code length and decoded data corresponding to certain code words.

9. A decoding apparatus for decoding variable length code word, comprising:

a code word number storing table for storing a number of code words which have a specified code length and being indexed by a code length, the number of code words corresponding to each code length being obtained from a header of inputted bit stream to be decoded;

a decoded data storing table for storing decoded data obtained from the header of the inputted bit stream;

a separator for separating data whose bit length is N indicated by a counter from the inputted bit stream;

a comparator for comparing the value of the separated data with stored number of code words indexed by the code length N in the code word number storing table; and a controller for, if the value of the separated data is smaller than the stored number of code words indexed by the code length N, obtaining target decoded data from the decoded data storing table using a pointer whose value is calculated by adding the separated data to a starting address of stored decoded data corresponding to a code word of the code length N in the decoded data storing table.

10. The decoding apparatus of claim 9, wherein the controller, if the value of the separated data is not less than the number of code words indexed by the code length N, subtracts the stored number of code words from the value of the separated data and increases N by one.

11. The decoding apparatus of claim 9, wherein the inputted bit stream to be decoded is encoded by JPEG standard encoding system.

12. The decoding apparatus of claim 9, wherein the inputted bit stream to be decoded consists of a header and a code word sequence, the header comprising the number of code words corresponding to each code length and decoded data corresponding to certain code words.

13. A decoding apparatus for decoding variable length code word, comprising.
- a code word number storing table for storing a number of code words which have a specified code length and being indexed by a code length, the number of code words corresponding to each code length being obtained from a header of inputted bit stream to be decoded;
- a decoded data storing table for storing decoded data obtained from the header of the inputted bit stream;
- a separator for separating data whose bit length is N indicated by a counter from the inputted bit stream;
- a comparator for comparing the value of the separated data with stored number of code words indexed by the code length N in the code word number storing table;
- an accumulative adder for adding accumulatively the number of code words; and
- a controller for, if the value of the separated data is smaller than the stored number of code words indexed by the code length N, obtaining target decoded data from the decoded data storing table using a pointer whose value is calculated by adding the value of the separated data to an accumulated number of code words.

14. The decoding apparatus of claim 13, wherein the controller, if the value of the separated data is not less than the number of code words indexed by the code length N, subtracts the stored number of code words from the value of the separated data and increases N by one.

15. The decoding apparatus of claim 13, wherein the inputted bit stream to be decoded is encoded by JPEG standard encoding system.

16. The decoding apparatus of claim 13, wherein the inputted bit stream to be decoded consists of a header and a code word sequence, the header comprising the number of code words corresponding to each code length and decoded data corresponding to certain code words.

17. A computer readable recording medium for storing decoding program to cause a computer to execute processing for decoding variable length code word, the program comprising:
- a module for generating a code word number storing table for storing a number of code words which have a specified code length and being indexed by a code length, the number of code words corresponding to each code length being obtained from a header of inputted bit steam to be decoded;
- a module for generating a decoded data storing table for storing decoded data obtained from the header of the inputted bit stream;
- a module for separating data whose bit length is N indicated by a counter from the inputted bit stream;
- a module for comparing the value of the separated data with stored number of code words indexed by the code length N in the code word number storing table; and
- a module for, if the value of the separated data is smaller than the stored number of code words indexed by the code length N, obtaining target decoded data from the decoded data storing table using a pointer whose value is calculated by adding the value of the separated data to a starting address of stored decoded data corresponding to a code word of the code length N in the decoded data storing table.

18. The medium of claim 17, further comprising:
- a module for, if the value of the separated data is not less than the number of code words indexed by the code length N, subtracting the stored number of code words from the value of the separated data and increasing N by one.

19. The medium of claim 17, wherein the inputted bit stream to be decoded is encoded by JPEG standard encoding system.

20. The medium of claim 17, wherein the inputted bit stream to be decoded consists of a header and a code word sequence, the header comprising the number of code words corresponding to each code length and decoded data corresponding to certain code words.

21. A computer readable recording medium for storing decoding program to cause a computer to execute processing for decoding variable length code word, the program comprising:
- a module for generating a code word number storing table for storing a number of code words which have a specified code length and bang indexed by a code length, the number of code words corresponding to each code length being obtained from a header of inputted bit stream to be decoded;
- a module for generating a decoded data storing table for storing decoded data obtained from the header of the inputted bit stream;
- a module for separating data whose bit length is N indicated by a counter from the inputted bit stream;
- a module for comparing the value of the separated data with stored number of code words indexed by the code length N in the code word number storing table;
- a module for adding accumulatively the number of code words; and
- a module for, if the value of the separated data is smaller than the stored number of code words indexed by the code length N, obtaining target decoded data from the decoded data storing table using a pointer whose value is calculated by adding the value of the separated data to an accumulated number of code words.

22. The medium of claim 21, further comprising:
- a module for, if the value of the separated data is not less than the number of code words indexed by the code length N, subtracting the stored number of code words from the value of the separated data and increasing N by one.

23. The module of claim 21, wherein the inputted bit stream to be decoded is encoded by JPEG standard encoding system.

24. The decoding method of claim 21, wherein the inputted bit stream to be decoded consists of a header and a code word sequence, the header comprising the number of code words corresponding to each code length and decoded data corresponding to certain code words.

* * * * *